United States Patent [19]

Kuehnle et al.

[11] 4,278,528
[45] Jul. 14, 1981

[54] RECTILINEAR SPUTTERING APPARATUS AND METHOD

[75] Inventors: Manfred R. Kuehnle, New London, N.H.; Arno K. Hagenlocher, Framingham; Nicholas A. Giardino, Sharon, both of Mass.

[73] Assignee: Coulter Systems Corporation, Bedford, Mass.

[21] Appl. No.: 83,220

[22] Filed: Oct. 9, 1979

[51] Int. Cl.³ .............................................. C23C 15/00
[52] U.S. Cl. ................................ 204/298; 204/192 R
[58] Field of Search ............... 204/192 R, 192 C, 298; 118/718–721, 624, 625, 638

[56] References Cited

U.S. PATENT DOCUMENTS

| | | | |
|---|---|---|---|
| 3,939,052 | 2/1976 | Riley | 204/192 |
| 4,107,350 | 8/1978 | Berg et al. | 427/38 |

FOREIGN PATENT DOCUMENTS 52-5682  1/1977  Japan ..................................... 204/298

OTHER PUBLICATIONS

Aronson et al., "Inline Production Magnetron Sputtering", *Vacuum*, vol. 27, pp. 151–153 (1977).
B. J. Williams et al., "Practical Design Aspects of a Continuous Vacuum RF Sputtering Machine", *J. Vac. Sci. Technology*, vol. 7, pp. 278–281 (1970).
T. M. Byrne et al., "Continuous Parallel—Plate RF Sputtering System", *IBM Tech. Disc. Bull.*, vol. 13, pp. 1034–1036 (1970).

*Primary Examiner*—Aaron Weisstuch
*Attorney, Agent, or Firm*—Silverman, Cass & Singer, Ltd.

[57] ABSTRACT

Sputtering apparatus in which a substrate passes through a sputtering chamber in a continuous rectilinear movement. The chamber is formed in a coffer-like vessel which has a closure and a body that are brought together into a sealing engagement to form the chamber. There is an air lock at opposite ends of the coffer for the substrate to enter and leave.

The sputtering conditions are provided by suitable gases, pumps, electrical connections and the like, these being admitted or led into the chamber. Electrode pairs are provided, one of each pair being mounted on the closure the other in the body to give good access thereto. The one mounted on the closure may be the anode and the other the cathode or vice versa. The sputtering is carried on with r.f. power.

The closure may be hinged.

For sputtering selectively, masks may be interposed between the targets and the anodes. Such masks will result in strip sputtering.

Especially for sputtering on substrates which are heat-sensitive, magnetic fields can be established in the sputtering gaps to sweep electrons out of the gap and prevent their impinging against the critical parts of the substrate.

Roller or drive systems may be provided in the coffer along with other apparatus.

15 Claims, 8 Drawing Figures

RECTILINEAR SPUTTERING APPARATUS AND METHOD

FIELD AND BACKGROUND OF THE INVENTION

The field of the invention is r.f. sputtering and said invention is especially concerned with the type of r.f. sputtering in which a layer or coating of material is sputtered onto a surface of an elongate web of flexible substrate moving linearly and continuously through a sputtering chamber.

With respect to the background of the invention, most sputtering apparatus is of the batch variety, that is, of a type in which a sputtering vessel is closed with a substrate member sealed inside; the sputtering conditions are established; the substrate member is moved through the sputtering plasma and coated; the sputtering conditions are discontinued; and the vessel is opened, the substrate member removed and a new one is installed therein. Then the process is repeated. Even apparatus which is constructed to enable sputtering of a relatively long substrate member, say of the length of several hundred meters, played off a supply reel and wound onto a take-up reel all on the interior of a vessel is a batch device. Time is lost in opening and closing the vessel, reestablishing the sputtering conditions, retuning the electronics, etc. Notwithstanding great effort to duplicate conditions from batch to batch, uniformly is difficult to achieve. Furthermore, variations in the ambient atmosphere from batch-to-batch affect the coatings because of the need for exposure during installation and removal of the substrate member.

Advantages are achieved in moving a substrate member that is in the form of an elongate web through apparatus which can continue to sputter-coat the substrate member under uniform conditions so long as the substrate is passing through. The apparatus is an elongate vessel which forms a sealed chamber, and the substrate member enters and exits by way of air locks which are maintained at low pressure by means of suitable pumps. The movement is called rectilinear because the general effect is to transport the substrate in a straight line, but there may be and usually are drive means in the apparatus which comprise rollers at least partially around which the substrate may move.

The targets and anodes are arranged parallel to one another so that sputtering gaps are established in the spaces between. The substrate is passed through these gaps in contact with the anodes and moves in a plane parallel to those of the anode and target faces.

One of the problems which arise in the construction of apparatus of this type is the difficulty of access to the electrodes for replacement and cleaning. Another problem is the difficulty of threading the substrate member through the apparatus. Another problem is that the apparatus is expensive if it is dedicated to only one type of substrate and one type of target material.

It is often desired to sputter an elongate substrate member with one or more stripes of sputtered material. This presents the problems of how to do it economically and with simple apparatus; how to be able to change the size and location of the stripes; how to use the same apparatus for non-stripe sputtering.

Another set of problems arises when one wishes to sputter substrate material that is heat-sensitive. Paper and various plastics will scorch and even be destroyed during sputtering because the electrons that are produced in the plasma and which do not contribute to the coating are driven against the substrate and heat it inordinately. Documents of value are capable of being made of paper or other sheeting that has been tagged with bands or stripes of non-visible material sputtered thereon. Genuineness and denomination can be identified from such tagging, but the tagging cannot be done if the sheeting material is burnt by the method of application.

The invention is directed to the solution of these and many other problems.

PRIOR ART

The invention herein can be used for sputtering insulator material such as inorganic photoconductors upon substrates such as polyester and sheet metal. For example, materials and methods disclosed in U.S. Pat. No. 4,025,339 are of interest in considering the invention herein.

Batch types of apparatus and methods are disclosed in the following U.S. Pat. Nos.:
 3,829,373
 3,884,787
 3,905,887
 4,013,539
 4,014,779
 4,026,787

Several of these patents disclose introducing ribbon substrate through air locks, but complex mechanisms are proposed to lead the ribbon multiple turns around a drum on the interior of the apparatus in order to get sufficient coating while the ribbon is passing through the apparatus. Wide webs are impossible to sputter coat by these devices and methods.

Other prior art known to the applicants comprise the following U.S. Pat. Nos.:
 2,965,067
 2,989,026
 3,294,670
 4,009,090

The first three of these relate to vacuum coating apparatus which applicants do not consider analogous. The last of these teaches a sputter-coating process for putting a coating on rigid glass sheets which move through a plurality of chambers.

An article entitled "What is 'in-line' Sputtering" by Hurwitt and Aronson appeared in April 1975 Research/Development, p. 43, 44 and mentions U.S. Pat. No. 3,294,670. This may be of interest.

No representation is made as to the comprehensiveness of the prior art mentioned above; no representation is made as to pertinence or relevance; no inferences should be drawn that such art as mentioned is analogous to the invention.

SUMMARY OF THE INVENTION

The sputtering apparatus of the invention comprises an elongate vessel in the form of a coffer made up of two parts, a closure and a body. There is an air lock at each end of the coffer and a substrate member in the form of an elongate web enters at one end, passes through the interior of the coffer and leaves at the other end.

The interior of the coffer has structure to enable the establishment of r.f. sputtering conditions therein, including targets and anodes in suitable pairs. The targets and anodes are generally planar and parallel, forming a sputtering gap between them, the substrate member being led and directed to pass through the sputtering gap of each pair of electrodes by suitable guiding and/or driving means which are provided in the coffer.

When the closure is in place on the body, it is sealed thereto and thus provides the sputtering chamber on the interior of the coffer. The coffer is thus a sputtering vessel and has connections for pump-down, introduction of background gas, electrical connections for the electrodes, etc.

An important feature of the invention is that the closure may and preferably will carry parts of the interior apparatus or components of the coffer so that when the closure is separated from the body, either completely or swung away on hinges, free access is had to such parts or components. Additionally, in leading the substrate member through the coffer it need not be broken but can be laid in place. The electrode pairs, the drive roller groupings and the air lock halves may be divided by this arrangement and brought into operative juxtaposition when the coffer is closed.

One or more slotted masks may be provided, each mask being suitably interposed between the target or targets of a target-anode pair to enable selective sputtering on the substrate member. The substrate member will be moving in engagement with the anode so that the mask separates the substrate member from the target or targets. A target-anode pair may comprise an anode and one or several targets. If several, they are respectively aligned with openings of the mask. The mask may be readily removed or swung aside to give access to the targets or to enable changing the mask and/or the targets and/or the positions of the targets.

In using the apparatus for sputtering onto heat-sensitive material such as paper and plastics, permanent magnets are mounted under the targets or anodes to produce magnetic fields in the sputtering gaps. These fields divert or spin off or drive away the free electrons produced during sputtering to prevent damage to those parts of the substrate member which are being located or striped.

DESCRIPTION OF THE PREFERRED EMBODIMENTS

Figure 1:
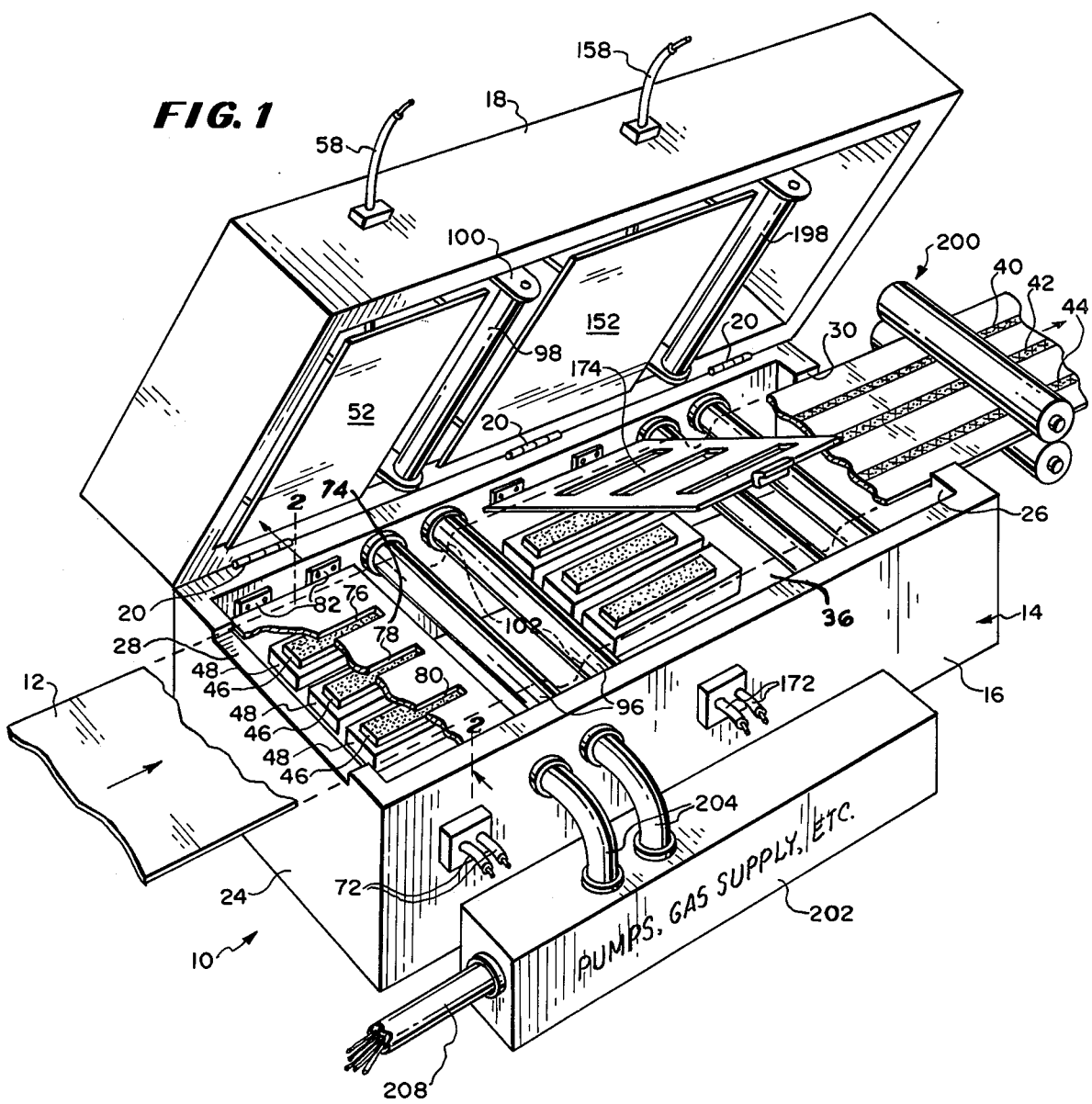
FIG. 1 is a more or less diagrammatic perspective view of an apparatus which is constructed in accordance with the invention.

Referring to FIG. 1, there is illustrated in perspective an apparatus designated generally by the reference character 10, which is provided for the purpose of sputtering materials onto an elongate web 12 of substrate material. According to the invention, the apparatus 10 is suitable for sputtering onto different types of materials such as paper, plastic, sheet metal and the like. The material is required to be flexible so that it may be passed through the apparatus and driven and the apparatus is required to be capable of being modified for use with different kinds of material. For example, if the substrate is an insulating material generally no problems arise in connection with the passing the web 12 through the apparatus because of electrical leakage and the like. In the case of conductive material such as sheet metal care must be taken to prevent short circuiting, dangerous voltages and currents, and so forth.

The apparatus 10 as illustrated comprises a coffer 14 which has a lower body member 16 and an upper closure member 18. For purposes of this explanation reference may also be had to FIG. 3 which is a diagrammatic view and which will assist in the understanding of the invention.

Figure 2:
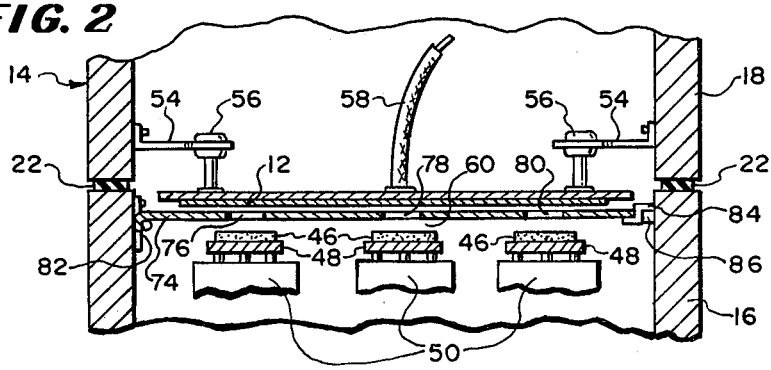
FIG. 2 is a fragmentary sectional view taken generally through the plane which is indicated by the arrows of FIG. 1, but in this case the cover of the apparatus is closed and a web of substrate material is in place.

The closure 18 as viewed in FIG. 1 is hinged to an upper edge of the body member 16 by means of hinges shown at 20 by means of which the closure member 18 may be swung to an open position as shown. The body member 16 and the closure member 18 may be engaged together as indicated in FIG. 2 upon suitable gasket means 22 carried upon the face-to-face edges. Such gasket means are not shown in FIG. 1 but are illustrated in FIG. 2. The end walls 24 and 26 of the body members 16 are provided with air locks as indicated symbolically at 28 and 30 respectively. These air locks may comprise parts which are formed when the closure member 18 and body member 16 are brought together so that separating the closure member and body member will in effect open the air lock to enable a web such as 12 to be laid down therein. Although not illustrated in FIG. 1, such air locks as 28 and 30 would be normally served by suitable pumps shown at 32 and 34 in FIG. 3.

Instead of being hinged, the closure member 18 may be capable of complete separation from the body member 16. Inasmuch as the apparatus 10 is intended for relatively high speed, high throughput production coating the apparatus may be 10 or 20 meters long. It will be heavy so that the closure member 18 can be attached to a hoist or lift and be capable of removal and preferably upending so that its interior is accessible.

Although not illustrated, it will be understood that when the body member 16 has the closure member 18 engaged thereon clamping means will be provided for holding the members in sealing face-to-face engagement so that an enclosed chamber 36 (see FIG. 3) is formed within the coffer 14.

It is understood from the prior art references which have been mentioned above that in order to achieve a sputtering condition it is required that there be a target or cathode means and anode means, means for evacuating the chamber within which these electrodes are positioned, means for introducing background gas to assist in the sputtering and to provide the heavy ions for bombarding the target, means for guiding and driving the substrate material through the apparatus, means for measuring and controlling the conditions within the chamber and means for energizing the electrode system. In the case of the latter means, the invention is concerned with sputtering by r.f. so that it is required that the cathodes or targets be suitably mounted and insulated and coupled to outside r.f. energy sources while the anodes may be coupled to ground or to a source of anode bias as explained in the references. For purposes of the discussion herein the anodes will be considered connected to one or the other of ground or a bias source so that in FIGS. 4 and 5, as will be explained, the anodes are connected to what is referred to as an anode connection.

An important feature of the invention lies in its extreme flexibility. The apparatus can be used for laying down sputtered stripes of material onto the web 12, three such stripes of material being shown in FIG. 1 at 40, 42 and 44. The number of stripes may be varied, the materials of the stripes may be different from one another, the locations of the stripes may be changed, and they may be placed on the top or bottom of the web or on both surfaces. If desired, a complete coating without striping may be applied on the bottom or top of the web 12 or on both surfaces by slight modification of the mountings of the target and anode means. These may be selectively rotatable.

Continuing with a discussion of the flexibility of the apparatus 10, different sputtered materials may be laid down on the same surface or on the same track or stripe by providing targets of different materials along the length of the apparatus in the direction of movement of the web 12. Thus, doping, covering, bonding and the laying down of ohmic layers before photoconductive layers may be effected by suitable modification of the apparatus.

The air lock dimensions are readily changed especially where as intended the slits or slots forming the air locks are added at the points 28 and 30. Magnetic fields as will be described may or may not be used. Apparatus may be coupled to other units through interconnection of air locks so that there is no necessity for the web 12 to be passed through air. Cleaning and conditioning units may be coupled in line with the apparatus 10.

Referring now to FIGS. 1 and 2, in the apparatus which is illustrated relatively narrow and elongate targets 46 are shown connected to base plates 48 which are in some form or by some means mounted within the body member 16. Platforms or the like are indicated at 50 in FIG. 2 but it will be understood that where necessary these are insulated, carry coolant, have electrical connections and couplings, have mechanical adjusting devices, etc. Preferably such mountings 50 are rotatable to enable changing the aspects and/or positions of the targets 46.

Inasmuch as it is intended that the targets 46 will be sputtering stripes of target material as shown at 40, 42 and 44, (shown on top of the web 12 for clarity, but actually being deposited on the bottom) these targets are arranged parallel with the direction of movement of the web 12 which may be assumed to the right as viewed in FIG. 1. As known in sputtering at r.f., a heavy, unreactive gas such as argon or the like is introduced into the sputtering chamber after it has been pumped down, the high voltage existing between the targets and an anode serving to ionize the gas so that the ions are driven toward the cathode or target where they bombard the same and literally splash atoms or molecules out of the target, these being driven toward the anode.

Figure 3:
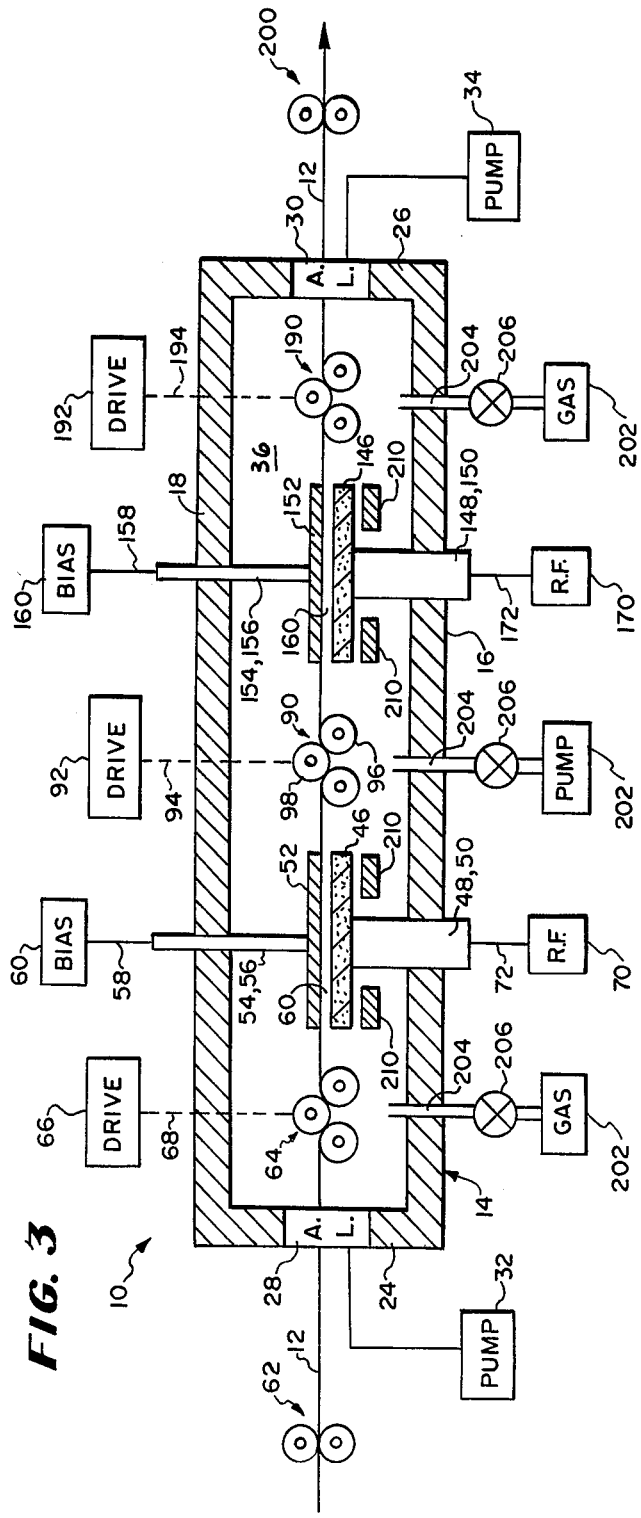
FIG. 3 is a diagrammatic view of apparatus which is constructed in accordance with the invention taken along the length thereof, the view being diagrammatic and indicating the components thereof by symbols for the purposes of explanation.

It will be appreciated that the description thus far is concerned only with what may be termed the first stage of the sputtering activity taking place within the chamber 36 that is formed in the apparatus 10. This is on the left side of FIG. 1 and FIG. 3. Inasmuch as no material is knocked out of the anode, there may be a single anode serving all of the targets 46. This anode illustrated at 52 is mounted to the interior of the closure member 18 by suitable brackets 54 and standoff insulators 56 that enable the anode to extend literally out of the closure member 18, below its bottom facing edges as viewed in FIG. 2. This assumes also that there is a connection to the anode 52 which will not be at ground potential, because if it were at ground potential there would be no need for standoff insulators. A cable or conductor 58 is shown connected to the anode 52 and extending to some form of what has been termed anode connection 60. In FIG. 3 the connection 60 is designated "bias" so that the mounting 54, 56 is required to insulate the anode 52 from the surrounding structure.

It should be pointed out that the so-called surrounding structure which comprises generally the walls, ends, etc., of the coffer 14 is formed of metal to be grounded for safety purposes, and although illustrated as solid for ease of understanding, there can be interior space for thermal insulation if desired.

As in the case of conventional sputtering, the substrate which in this case comprises the web 12 is in engagement with the facing surface of anode 52. There will be formed a sputtering gap 60 between each target 46 and the anode 52. Symbolically, the targets 46 are represented by a single member in FIG. 3 and the base plates 48 and the mounting 50 are indicated by a single member designated 48, 50.

According to FIG. 3 the web 12 is guided and/or driven by a set of rollers 62 before entering the air lock 28, passes into the chamber 36 and is guided and/or driven by a second set of rollers 64 which are not illustrated in FIG. 1 and thereafter enters the sputtering gap 60. The drive means 66 shown in FIG. 3, connected by a suitable mechanical connection 68 to the set of rollers 64, may be on the interior of the coffer 14 or connected thereto through one of the walls.

The targets 46 are energized by means of an r.f. source 70 which is shown in FIG. 3 but not illustrated except by way of connections 72 in FIG. 1. These connections pass through a wall of the body member 16 to the source 70 and may comprise a single or multiple cables depending upon the manner of coupling and driving said targets 46. It will be understood that the illustrations are merely diagrammatic and symbolic.

As mentioned previously, one of the purposes of the invention herein is to achieve the sputtering of stripes upon a moving web of substrate material. A mask 74 is provided in the sputtering gap 60 as illustrated in FIGS. 1 and 2 but not in FIG. 3. The mask is in the form of a metal sheet-like member which extends across the path of the web 12 and is located between the web and the targets 46. Mask 74 is grounded in order to have a blocking effect. It is effectively most positive with respect to the targets 46 and will receive particles of the target material that engage against it. The mask 74 has slots 76, 78 and 80 which correspond respectively to the positions which it is intended to provide for the stripes 40, 42 and 44. These slots are aligned with the location of the targets 46 so that if one is going to be sputtering only stripes there is no need for large targets. The mask 74 is connected to one side wall of the coffer 14 in this case to the body member 16, by means of hinges 82 which may be removable if desired, the opposite side edge of the mask 74 being provided with a tongue or similar extension 84 adapted to engage a bracket 86 that is attached to a side wall of the coffer 14 on the inside thereof (FIG. 2). A latch may be provided if desired to hold the mask in place, but it is clear that the mask may be swung upwardly to give access to the targets 46 as indicating with the second stage of sputtering. Here the mask 174 is constructed exactly like the mask 74 and is shown in partially raised condition.

Following the first sputtering stage which has been thus far described, the web 12 passes through a set of rollers 90 as illustrated in FIG. 3 which guide and/or drive the web. The drive means 92 are shown connected by way of the mechanical connection 94 to the set of rollers. As previously mentioned, it is essential that the web 12 be flexible so that it may take partial turns around rollers of the set in moving through the chamber 36. In this instance, the set of rollers comprises three, two of which are journalled in the body member 16 and one of which is journalled in brackets 100 carried by the closure member 18. The bottom two rollers are designated 96 and the top roller is designated 98. The brackets 100 which mount the top roller 98 extend out of the open face of the closure 18 so that the roller 98 may be moved downward and into engagement with the rollers 96 forming with said bottom rollers a nip that engages the web 12. The path which is followed normally by the web 12 in moving through the set of rollers 90 is shown in broken lines in FIG. 1 at 102.

Because the roller set 90 can be separated, when the web is installed within the coffer 14 or threaded through the same by merely lifting the closure 18 the set of rollers 90 is separated or opened, making it a simple manner to lay the web down upon the two rollers 96. When the closure member 18 is brought into sealing condition the roller 98 is in final operating condition on top of the web 12.

The second stage of sputtering of the apparatus 10 is substantially the same as the first stage which has been described. As seen in FIG. 1 there is an anode 152 which is the same as the anode 52 mounted within the cover member 18 by suitable means 154, 156 and connected by the coupling 158 to an anode connection 160. Targets 146, support or mounting 148, 150, couplings 172 and the roller set 190 are respectively the same as those previously described. The reference numerals of the second stage are one hundred numbers greater in equivalent components.

The web 12 passes out of the air lock 30 in coated condition and continues through a set of rollers 200 for further processing if desired or for accumulation.

The apparatus 10 is associated with various equipment for establishing and maintaining the sputtering condition within the chamber 36. Generally a block is shown at 202 with connecting pipes such as 204, valves 206, etc. Remote controls, connection cable and the like are indicated at 208 extending to other apparatus.

In the case of sputtering upon paper or thin plastic material which is likely to be scorched or burned during the sputtering because of impingement of electrons which are produced during the sputtering process, magnet means are used to drive the electrons out of the sputtering gap 60 of the first stage and 160 of the second stage. These magnet means are not seen in either FIGS. 1 and 2 and are shown symbolically at 210 in FIG. 3. Permanent magnets are preferred and these produce a d.c. field which diverts the electrons out of the respective gaps.

Figure 4:
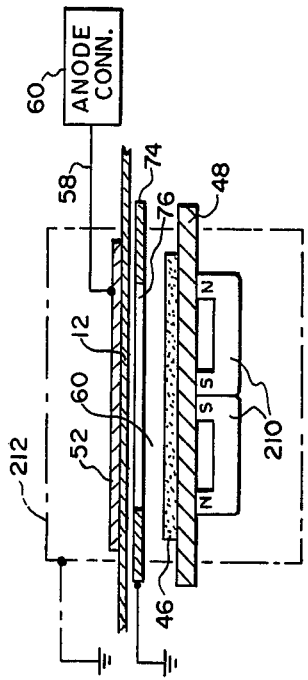
FIG. 4 is a transverse diagrammatic sectional view through the apparatus for the purpose of explaining a modified form of the invention.

FIG. 4 is a diagrammatic sectional view illustrating the structure for deflecting or diverting electrons from the sputtering gap. The reference numerals used will be the equivalent of those of the first stage described in FIG. 1.

The anode 52 is shown parallel with the target 46 and forming a sputtering gap 60 between them. It should be appreciated that the dimensions are somewhat exaggerated for clarity. A typical sputtering gap would be of the order of 50 millimeters or so with the substrate 12 a fraction of a millimeter thick and engaged against or riding upon the inner surface of the anode 52. The mask 74 is here shown with a gap such as 76, and it would be located a few millimeters from the substrate 12.

The target 46 is mounted on a base plate 48 to the bottom of which are secured the permanent magnets 210. The magnets are disposed so that they form a more or less oval field along the length of the gap, the view in FIG. 4 being transversely of the gap. The view is diagrammatic and symbolic; hence, the exact disposition of magnets and the target relative to movement of the substrate may not necessarily be precise. Those skilled in the art, however, will have no problem to locate the magnets so that the field will drive the electrons away from the substrate preferably off to the sides thereof where the electrons are captured by either the surrounding metallic structure or a ground plane deliberately placed to capture the same. Such ground plane is indicated at 212 in FIG. 4.

Figure 5:
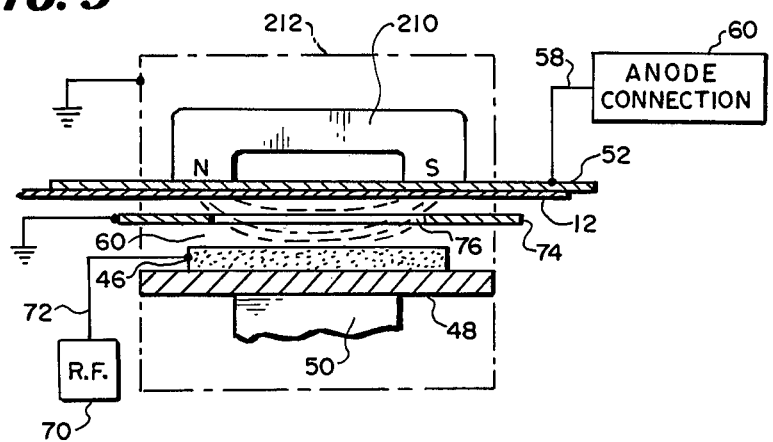
FIG. 5 is a diagrammatic sectional view showing a modified form of the invention, the illustration being a fragmentary portion of the apparatus.

In FIG. 5 the only difference which is disclosed is that in this case the magnets such as 210 are located behind the anode 52 instead of behind the target 46. A general indication of the resulting field in the gap 60 is obtained from the broken lines of FIG. 5.

Figure 5A:
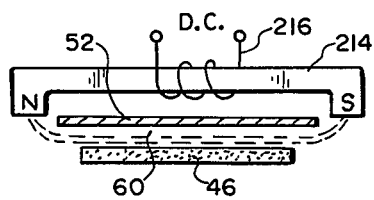
FIG. 5A is a sectional diagram showing a modified form of the invention illustrated in FIG. 5, again taken transversely of the direction of movement of the web of substrate material.

FIG. 5A illustrates a special type of arrangement in which an electromagnet is used. As in FIG. 5, the magnet 214 is behind the anode 52 and it may be relatively long in order or achieve a uniform field in the gap 60. Direct current is passed through a coil 216 wrapped around the body of the magnet 214 to give the increased field because of the length of the magnet.

Figure 6:
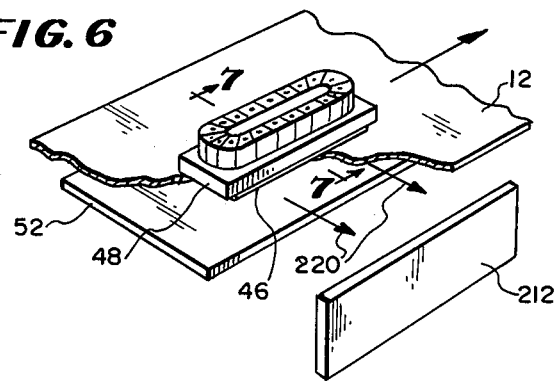
FIG. 6 is a perspective diagrammatic view illustrating the arrangement of magnets for purposes of explanation.

FIG. 6 illustrates an arrangement in which the target 46 and its base plate 48 are uppermost while the anode 52 is the bottom electrode. The substrate 12 is shown moving to the right, the mask not being illustrated here. The magnets are here shown arranged in an oval mounted on the rear surface of the base plate 48 in order to create a field which will drive electrons laterally as indicated by the arrows 220 toward a ground plane 212.

Figure 7:
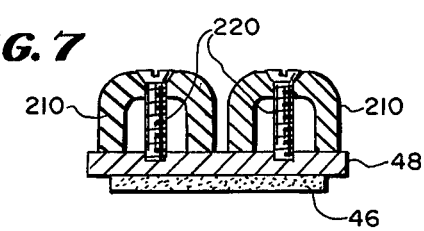
FIG. 7 is a fragmentary sectional view taken generally along the line 7—7 of FIG. 6 and in the indicated direction to show how horseshoe magnets are mounted to the base plate of a target.

FIG. 7 illustrates how the magnets are attached and arranged, the view being transversely of the assembly of FIG. 6. Individual horseshoe magnets 210 are bolted to the base plate by means of screws 220 passing through the magnet.

Variations and modifications may be made to the structures which are illustrated as preferred embodiments without departing from the spirit or scope of the invention as defined in the appended claims.

What it is desired to secure by Letters Patent of the United States is:

1. A sputtering apparatus for applying a sputtered coating onto a substrate member in the form of a continuous web passing through the apparatus which comprises:
  A. a coffer of metallic construction adapted to be grounded and having a closure member and a body member, the closure member adapted to be at least partially removed from the body member to expose the interior of both members and adapted to be brought into engagement with the body member in face-to-face sealed engagement to provide a substantially sealed chamber on the interior of the coffer,
  B. air lock means at opposite ends of the coffer arranged to enable a substrate member in the form of an elongate, flat, continuous web to pass into said chamber at an end of the coffer, substantially rectilinearly through said chamber and out of the other end of the coffer without varying the physical conditions within said chamber,
  C. sputtering target means adapted to be made of a material which is to be sputter-coated onto said web, and anode means, the target and anode means being arranged in flat planes parallel to one another and spaced apart to provide sputtering gaps, said target and anode means being mounted in said coffer, the target means being mounted to one of the closure member and body member, the mountings being such that the gaps are formed when the closure and body members are in said face-to-face engagement, but said target means and anode means are separated substantially from one another when the closure member is so separated from the body member,
  D. means within the coffer for guiding said web to pass through said gaps in said coffer, said guiding means including at least a part carried by said closure member and a part carried by said body member, said parts adapted, when operative, to be in engagement and to have said web between them, but being separated when said closure member is so removed from said body member whereby to enable said web to be placed in position for becoming subsequently engaged between said parts without breaking said web, and
  E. said coffer having means for establishing and maintaining sputtering conditions in said chamber when sealed and while said substrate member is passing through including means for connecting the target and anode means to a source of r.f. energy.

2. The sputtering apparatus as claimed in claim 1 in which there is a hinged connection between the closure and body members so that the closure member swings open.

3. The sputtering apparatus as claimed in claim 2 in which the hinged connection is along an edge of the coffer that extends parallel with the rectilinear path of movement of said web.

4. The sputtering apparatus as claimed in claim 1 in which said target and anode means are provided with means for establishing a magnetic field in at least one of the gaps formed between said target and anode means, said magnetic field establishing means being arranged to divert electrons in said gap from impinging against said substrate member during the sputtering process.

5. The sputtering apparatus as claimed in claim 4 in which said magnetic field establishing means comprise permanent magnet means mounted in proximity to one of said target and anode means.

6. The sputtering apparatus as claimed in claim 8 in which the permanent magnet means are mounted behind the anode means.

7. The sputtering apparatus as claimed in claim 5 in which the permanent magnet means are mounted behind the target means.

8. The sputtering apparatus as claimed in claim 1 in which there is a mask between the anode means and the cathode means, the mask being slotted and the substrate member adapted to move through the space between the mask and the anode means during the sputtering process whereby the sputtering process will produce stripes of sputtered material along the length of the web on the web where said web is exposed to said cathode means through said slots.

9. The sputtering apparatus as claimed in claim 1 in which the target means and anode means are separable when the closure member is removed from the body member whereby to give access to said target and anode means.

10. A sputtering apparatus for applying a sputtered coating onto a substrate member in the form of a continuous web, the coating being in the form of stripes laid onto the web along the length thereof, said apparatus comprising:
  A. a vessel forming a closed sputtering chamber and having an anode and target means arranged therein spaced apart whereby to form a sputtering gap between the anode and the target means,
  B. means for establishing and maintaining an r.f. sputtering condition within the vessel,
  C. means for moving the web into, through and out of said vessel and through the gap in a continuous process whereby to enable the target material to be sputtered onto the web while within said vessel,
  D. mask means in the gap having openings therein and permitting the movement of sputtered particles to the web only through the said openings while blocking all other particles so that the resulting deposit on the web comprises stripes, one being behind and in alignment with each opening, said mask means comprising a grounded planar member, said planar member being hinged and the anode being separable from the target means whereby when said anode and target means are separated, the planar member may be swung out of its normal position to give access to that which lies beneath it.

11. The apparatus as claimed in claim 10 in which said target means comprise a plurality of targets, one being disposed in alignment with each opening.

12. The apparatus as claimed in claim 11 in which said targets are generally of the same configuration as the respective openings behind which each is positioned and slightly larger than said respective openings.

13. The apparatus as claimed in claim 10 in which the grounded planar member is mounted to the vessel.

14. The apparatus as claimed in claim 10 in which the grounded planar member is movable out of said gap.

15. The apparatus as claimed in claim 10 in which the planar member is removable from said position in said gap.

* * * * *